(12) United States Patent
Murasato et al.

(10) Patent No.: US 11,656,547 B2
(45) Date of Patent: May 23, 2023

(54) IMPRINT APPARATUS, IMPRINTING METHOD, AND PRODUCT MANUFACTURING METHOD

(71) Applicant: CANON KABUSHIKI KAISHA, Tokyo (JP)

(72) Inventors: Naoki Murasato, Utsunomiya (JP); Takafumi Miyaharu, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/824,487

(22) Filed: Mar. 19, 2020

(65) Prior Publication Data
US 2020/0310247 A1    Oct. 1, 2020

(30) Foreign Application Priority Data
Mar. 26, 2019   (JP) .............................. JP2019-059214

(51) Int. Cl.
*G03F 7/00* (2006.01)
*B29C 33/42* (2006.01)

(52) U.S. Cl.
CPC .......... *G03F 7/0002* (2013.01); *B29C 33/424* (2013.01); *B29C 2033/426* (2013.01)

(58) Field of Classification Search
CPC .......................... G03F 7/0002; B29C 33/424; B29C 2033/426
See application file for complete search history.

(56) References Cited

U.S. PATENT DOCUMENTS

| 2017/0146903 A1* | 5/2017 | Hayashi | ................. B82Y 10/00 |
| 2018/0067392 A1* | 3/2018 | Murasato | .............. G03F 7/0002 |
| 2018/0264712 A1* | 9/2018 | Asano | .................... B29C 59/002 |
| 2019/0086795 A1* | 3/2019 | Jung | ..................... G03F 7/0002 |

FOREIGN PATENT DOCUMENTS

| JP | 2011-521438 A | 7/2011 |
| JP | 2015-138963 A | 7/2015 |
| JP | 2018-92997 A | 6/2018 |
| JP | 2018-152515 A | 9/2018 |
| JP | 2019-021749 A | 2/2019 |

* cited by examiner

*Primary Examiner* — Timothy Kennedy
*Assistant Examiner* — Alexander A Wang
(74) *Attorney, Agent, or Firm* — Canon U.S.A., Inc. IP Division

(57) ABSTRACT

An imprint apparatus for forming a pattern of an imprint material on a substrate by using a mold including a pattern formation area, the imprint apparatus includes a detection unit configured to detect a contact state of the imprint material on the substrate with the mold, a light modulation element configured to control an intensity distribution of irradiation light irradiating the substrate, and a control unit configured to control a timing of irradiating the substrate with the irradiation light having the intensity distribution controlled by the light modulation element based on a detection result of the detection unit.

15 Claims, 7 Drawing Sheets

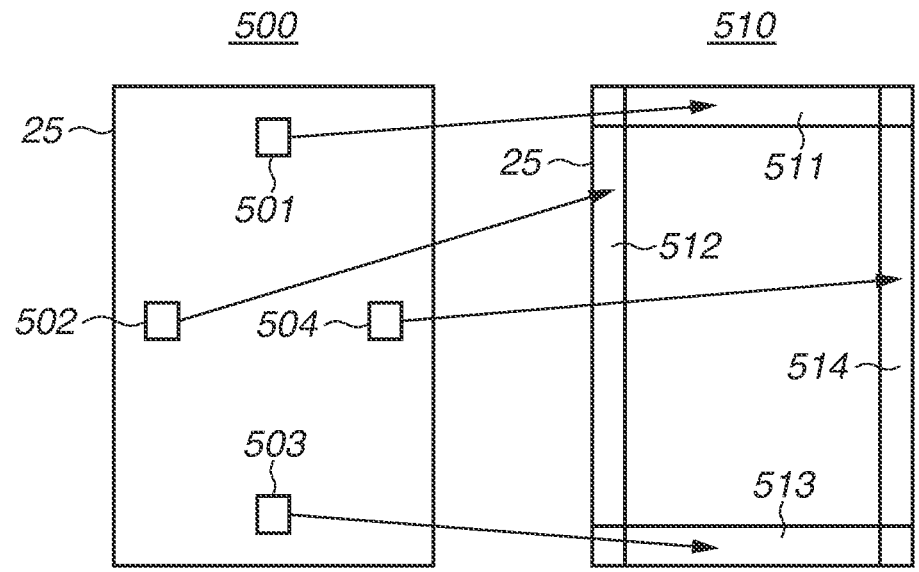
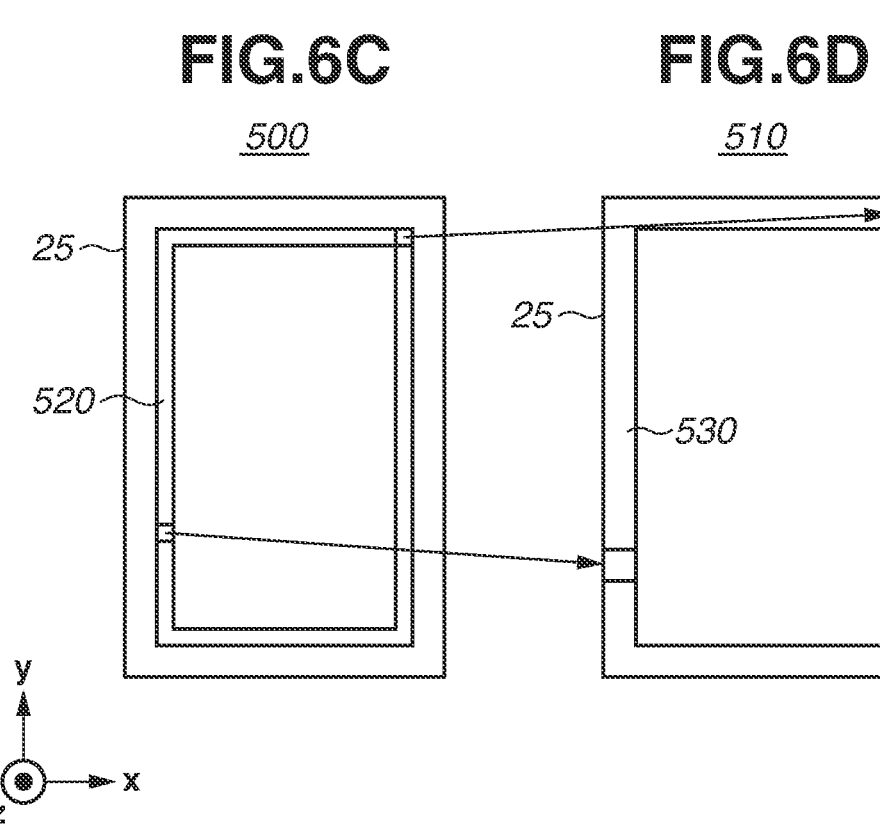

IMPRINT APPARATUS, IMPRINTING METHOD, AND PRODUCT MANUFACTURING METHOD

BACKGROUND

Field of the Disclosure

The present disclosure relates to an imprint apparatus, an imprinting method, and a product manufacturing method.

Description of the Related Art

A known method for manufacturing a product such as a semiconductor device or a micro electro mechanical system (MEMS) device includes an imprinting method in which an imprint material on a substrate is molded using a mold. In the imprinting method, the imprint material is supplied onto the substrate, and the supplied imprint material is brought into contact with the mold (pressing). Then, after the imprint material is cured in a state where the imprint material is in contact with the mold, the mold is separated (released) from the cured imprint material to form a pattern of the imprint material on the substrate.

In such an imprinting method, the imprint material is irradiated with curing light such as ultraviolet light in a state where the imprint material fills a space between the mold and the substrate, so that the imprint material is cured. At that time, the imprint material needs to densely fill the space between the mold and the substrate so that the pattern of the mold can be reliably transferred. On the other hand, it is necessary to prevent the imprint material from protruding into an adjacent shot region, which is the outside of a pattern area formed in the mold.

Japanese Unexamined Patent Application Publication (Translation of PCT Application) No. 2011-521438 discusses a method in which, when a mold is contacted with a polymerizable material (imprint material) being a photocuring resin, the outside of a pattern area formed in the mold is irradiated with light to prevent the imprint material from being extruded outside the pattern area.

In an imprint apparatus, when the imprint material on the substrate is contacted with the mold, the imprint material fills the space between the mold and the substrate by spreading outward from the center of the pattern area of the mold (or the shot region of the substrate). Further, in the imprint apparatus, it is necessary to irradiate an outer peripheral portion of the pattern area of the mold with curing light at an appropriate timing to cure the imprint material that is about to protrude outside the shot region. This is because if a timing of light irradiation is too early, the imprint material may be cured more than necessary, and if the timing of light irradiation is too late, the imprint material is extruded outside the pattern area of the mold. Thus, the timing of light irradiation can be determined in advance.

However, spread of the imprint material when the imprint material fills the space between the mold and the substrate (i.e., extent to which the imprint material is extruded) varies depending on various conditions, such as surface conditions of the mold and the substrate, an amount of supply of the imprint material, and viscosity characteristics of the imprint material. Thus, the outer peripheral portion of the pattern area may not be irradiated with light at an appropriate timing.

SUMMARY OF THE DISCLOSURE

According to an aspect of the present invention, an imprint apparatus for forming a pattern of an imprint material on a substrate by using a mold including a pattern formation area, the imprint apparatus includes a detection unit configured to detect a contact state of the imprint material on the substrate with the mold, a light modulation element configured to control an intensity distribution of irradiation light irradiating the substrate, and a control unit configured to control a timing of irradiating the substrate with the irradiation light having the intensity distribution controlled by the light modulation element based on a detection result of the detection unit.

Further features of the present invention will become apparent from the following description of exemplary embodiments with reference to the attached drawings.

BRIEF DESCRIPTION OF THE DRAWINGS

FIGS. 6A, 6B, 6C, and 6D are diagrams illustrating detection areas and irradiated areas in a shot region.

DESCRIPTION OF THE EMBODIMENTS

Figure 1:
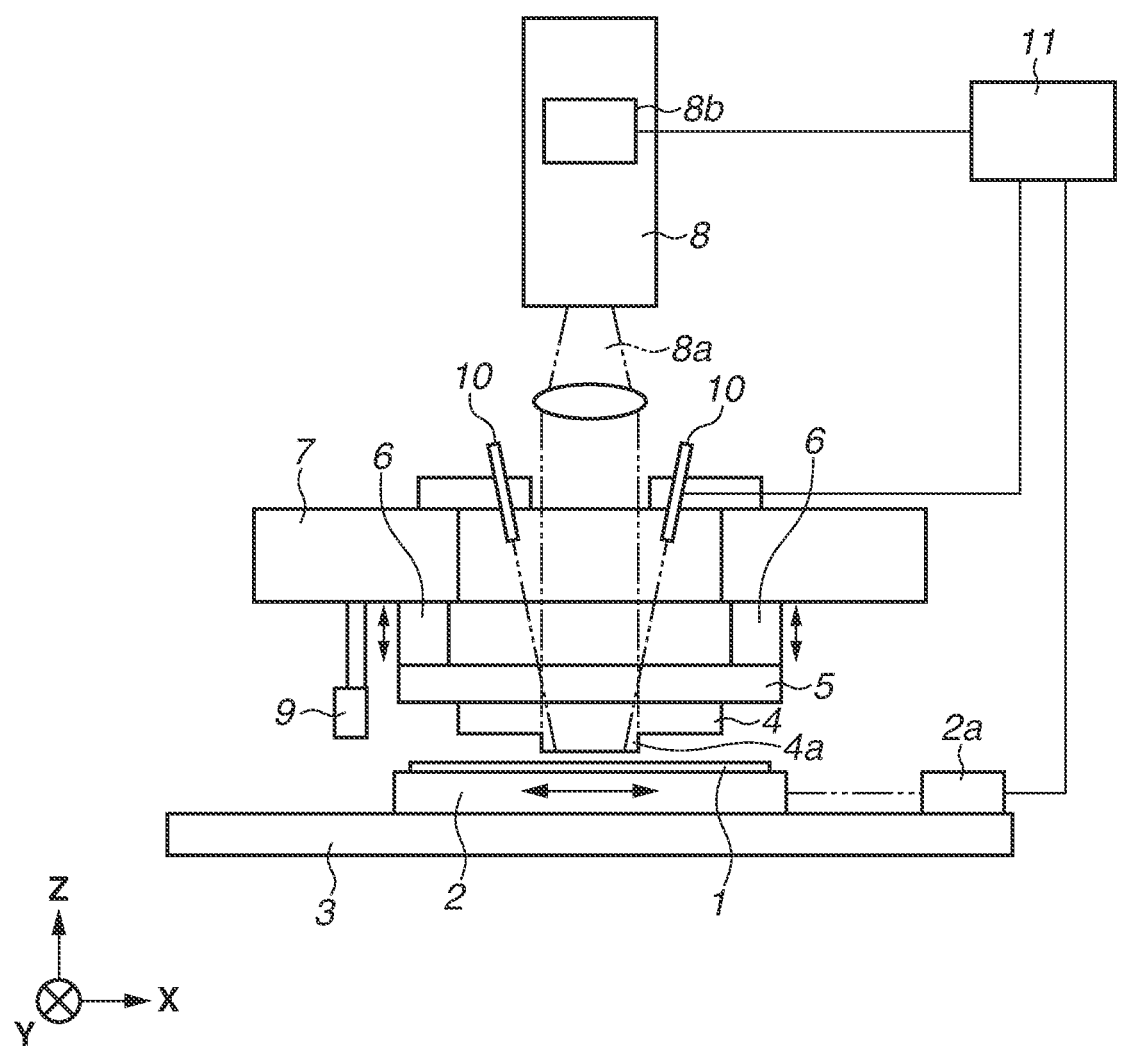
FIG. 1 is a diagram illustrating an imprint apparatus.

Exemplary embodiments of the present invention will be described below in detail with reference to the attached drawings. In each of the drawings, the same reference numerals are used to indicate identical members, and explanation is not repeated.

(Imprint Apparatus)

FIG. 1 is a diagram schematically illustrating a configuration of an imprint apparatus 100. The configuration of the imprint apparatus 100 will be described with reference to FIG. 1. The imprint apparatus 100 brings an imprint material supplied onto a substrate into contact with a mold and applies curing energy to the imprint material to form a pattern of a cured product onto which a depression-protrusion pattern of the mold is transferred.

Axes are defined, as illustrated in FIG. 1, so that a plane on which a substrate 1 is placed is referred to as an XY plane, and a direction perpendicular to the XY plane is referred to as a Z-direction. The imprint apparatus 100 can form patterns in a plurality of shot regions formed on the substrate 1 by repeating an imprint process. A pattern formed on a mold 4 is transferred onto an imprint material supplied onto the substrate 1 to form, on a surface of the substrate 1, an imprint material pattern corresponding to the pattern of the mold 4.

Glass, ceramics, metal, semiconductor, resin, or the like is used for the substrate 1, and a member made of a material different from the material of the substrate can be formed on the surface of the substrate 1 as necessary. More specifically, the substrate 1 includes a silicon wafer, a compound semiconductor wafer, quartz glass, and the like.

A substrate stage 2 can move the substrate 1 in an X-direction and a Y-direction and rotate the substrate 1 about a Z axis to move the entire surface of the substrate 1 under the mold 4. The substrate stage 2 includes a displacement sensor 2a configured to detect a movement position. The substrate stage 2 can be moved to a desired position by using a drive mechanism such as a motor based on a detected value of the displacement sensor 2a. A laser interferometer, an encoder, or the like can be used as the displacement sensor 2a. A base frame 3 holds and guides the substrate stage 2.

The mold 4 is used for molding the imprint material on the substrate 1. The mold 4 can also be called a template or an original plate. The mold 4 has a polygonal (rectangular) outer shape, and has a pattern area 4a (pattern formation area) in which a pattern (depression-protrusion pattern) to be transferred onto the substrate 1 is formed. On a surface of the mold 4 facing the substrate 1, the pattern area 4a (also referred to as a mesa part) protruding from a periphery is provided near the center. In the pattern area 4a, the depression-protrusion pattern to be transferred onto the substrate 1, such as a circuit pattern, is formed to have a three-dimensional shape. The mold 4 is made of a material such as quartz transmitting curing light 8a.

The imprint apparatus 100 includes a mold holding unit 5 configured to hold the mold 4, and a drive device 6 configured to move the mold 4 held by the mold holding unit 5 in a vertical direction and in a tilt direction. The mold holding unit 5 attracts a back surface of the mold 4 (surface on which the curing light 8a is incident) with a vacuum suction force or an electrostatic force to hold the mold 4. The drive device 6 is fixed to a surface plate 7 of an apparatus main body, and performs operations of contacting the mold 4 with the imprint material supplied on the substrate 1 (pressing step) and releasing the mold 4 from the imprint material (releasing step). When the imprint apparatus 100 contacts the mold 4 with the imprint material, the imprint apparatus 100 may drive the mold 4 to press against the imprint material or may drive the substrate 1 so that the imprint material is pressed against the mold 4. Further, the imprint apparatus 100 may move both the mold 4 and the substrate 1 to be brought into contact with each other.

An irradiation unit 8 irradiates the imprint material with the curing light 8a (e.g., ultraviolet light) through the mold 4 to cure the imprint material. If a material to be cured by irradiation with the ultraviolet light is used for the imprint material, the irradiation unit 8 is an ultraviolet light generation device. The irradiation unit 8 includes a shutter unit 8b configured to control an irradiation timing.

The imprint apparatus 100 includes a supply unit 9 (also referred to as a dispenser). The supply unit 9 is disposed near the mold holding unit 5, and supplies (applies) an uncured imprint material (also referred to as uncured resin) to the substrate 1. The imprint material according to the present exemplary embodiment is an ultraviolet curable resin material having a property of being cured by ultraviolet light irradiation as irradiation of the curing light 8a. The imprint material is selected based on various information such as information on a manufacturing process of the target semiconductor device. The amount of supply of the imprint material from the supply unit 9 is determined based on a thickness (residual layer thickness) and a density of the pattern of the imprint material to be formed on the substrate 1. The supply unit 9 may be provided outside the imprint apparatus 100. In such a case, the imprint material is supplied onto the substrate 1 in advance outside the imprint apparatus 100, and the substrate 1 supplied with the imprint material is subjected to a mold pressing process and a mold releasing process inside the imprint apparatus. A pattern of the imprint material is formed on the substrate 1.

A curable composition (sometimes referred to as an uncured resin) to be cured when curing energy is applied is employed as the imprint material. An electromagnetic wave, heat, or the like is employed as the curing energy. An example of the electromagnetic wave includes light such as infrared light, visible light, and ultraviolet light, whose wavelength is selected from a range of 10 nm or more and 1 mm or less.

The curable composition is a composition cured by light irradiation or by heating. The photocurable composition cured by light irradiation contains at least a polymerizable compound and a photopolymerization initiator, and may additionally contain a non-polymerizable compound or a solvent as necessary. The non-polymerizable compound is at least one selected from the group consisting of a sensitizer, a hydrogen donor, an internal mold release agent, a surfactant, an antioxidant, and a polymer component.

The imprint material can be applied onto the substrate 1 in a film form by using a spin coater or a slit coater. Further, the imprint material may be applied onto the substrate 1 in a form of droplets, or in a form of islands formed from connection of a plurality of droplets, or in a form of film by a liquid ejection head. The imprint material has viscosity (viscosity at 25° C.) of, for example, 1 mPa·s or more and 100 mPa·s or less.

The imprint apparatus 100 includes a mark measurement optical system (measurement unit) 10 configured to measure an alignment mark formed on the substrate 1 and an alignment mark formed on the mold 4. The mark measurement optical system 10 is also called an alignment scope, and includes a lens, an illumination system, and a detection sensor (image pickup element) inside. The mark measurement optical system 10 detects the alignment marks formed on the substrate 1 and the mold 4 to measure an amount of positional deviation of the substrate 1 and the mold 4. The alignment scope can measure relative positions of the mold 4 and the substrate 1 from the amount of positional deviation of the alignment marks. The imprint apparatus 100 can move at least one of the substrate stage 2 and the mold holding unit 5 by the measured amount of positional deviation to correct the positions to align the substrate 1 and the mold 4.

A control unit 11 includes a computer including a central processing unit (CPU) and a memory, and controls components of the imprint apparatus 100 based on a program stored in the memory. The control unit 11 controls operation and adjustment of the components of the imprint apparatus 100 to control the imprint process of forming a pattern on the substrate 1. The control unit 11 can perform positioning of the substrate stage 2 (substrate 1) based on a measurement value from the displacement sensor 2a. The control unit 11 can be provided in the imprint apparatus 100 or separately from the imprint apparatus 100 to control the components remotely.

Figure 2:
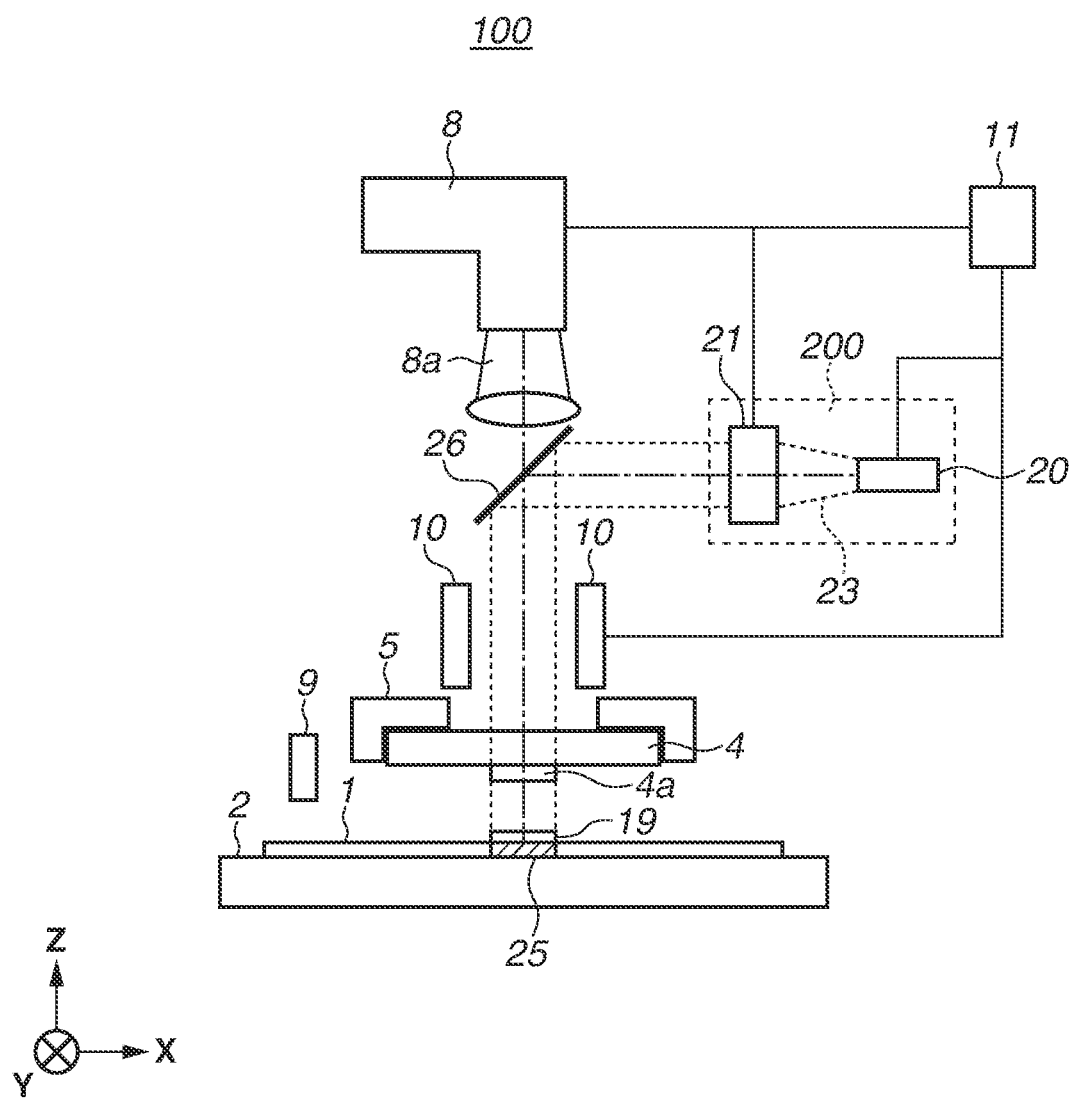
FIG. 2 is a diagram illustrating an imprint apparatus according to a first exemplary embodiment.

An imprint apparatus according to a first exemplary embodiment will be described with reference to FIG. 2. FIG. 2 is a diagram schematically illustrating the imprint apparatus 100 including a detection unit and a partial irradiation mechanism 200. The partial irradiation mechanism 200 irradiates a shot region on the substrate 1 with light in a frame shape based on a detection result of the detection unit. FIG. 2 also schematically illustrates a configuration and arrangement of the partial irradiation mechanism 200 provided in the imprint apparatus 100. In FIG. 2, the same reference numerals are used to indicate the same components as those of FIG. 1, and explanation thereof is not repeated.

The partial irradiation mechanism 200 can irradiate a shot region 25 with light in a frame shape. The shot region 25 serves as a processing target formed in advance on the substrate 1 carried into the imprint apparatus 100. When the pattern area 4a of the mold 4 and an imprint material 19 supplied onto the shot region 25 are brought into contact, it is possible to prevent the imprint material 19 from protruding from the pattern area 4a.

The partial irradiation mechanism 200 includes a light source 20 configured to emit irradiation light 23 to cure the imprint material 19 around the shot region 25 (around the pattern area 4a) formed on the substrate 1 or to increase viscosity of the imprint material 19. The partial irradiation mechanism 200 also includes a light modulation element 21 configured to adjust an irradiation amount, an irradiated area, and an intensity distribution of the irradiation light 23 with which the substrate 1 is to be irradiated, and an optical element 26 configured to reflect the irradiation light 23 so that the adjusted irradiation light 23 travels to the surface of the substrate 1.

The light source 20 emits light having a wavelength for curing the imprint material 19 or increasing the viscosity of the imprint material 19. The light modulation element 21 can emit light at a desired position of the irradiation light 23 from the light source 20 toward the surface of the substrate 1 to form a desired irradiated area (intensity distribution) in the shot region 25. Examples of the light modulation element 21 include a digital micromirror device (DMD), a liquid crystal display (LCD) device, and a liquid crystal on silicon (LCOS) device. The use of the light modulation element 21 makes it possible to freely set the irradiated area and the intensity distribution of the irradiation light 23 with which the substrate 1 is to be irradiated. In the digital micromirror device, a plurality of mirror elements is arranged on a reflection surface. A face direction of each of the mirror elements is individually adjusted to change a distribution of the irradiation amount of the irradiation light 23. The control unit 11 of the imprint apparatus 100 according to the present exemplary embodiment controls operation of at least the partial irradiation mechanism 200.

Next, the imprint process performed by the imprint apparatus 100 will be described. First, a substrate transport unit (not illustrated) transports the substrate 1 to the substrate stage 2 to place and fix the substrate 1 on the substrate stage 2. Subsequently, the substrate stage 2 is moved to a supply position of the supply unit 9. Then, the supply unit 9 supplies the imprint material 19 to the predetermined shot region 25 of the substrate 1, which is a supply step. Next, the substrate stage 2 is moved so that the shot region 25 of the substrate 1 supplied with the imprint material 19 is positioned immediately below the pattern area 4a of the mold 4. Next, the drive device 6 of the mold holding unit 5 is driven to bring the mold 4 into contact with the imprint material 19 supplied on the substrate 1 (pressing step).

When the mold 4 contacts the imprint material 19, the imprint material 19 fills the mold 4 along the depression-protrusion pattern formed in the pattern area 4a by the contact with the mold 4. At this time, the partial irradiation mechanism 200 is used to irradiate a region along an outer periphery of the pattern area 4a with the irradiation light 23 to prevent the imprint material 19 from protruding outside the pattern area 4a.

In the imprint apparatus 100 according to the first exemplary embodiment, the mark measurement optical system 10 is employed as the detection unit to determine an irradiation timing of the irradiation light 23 by the partial irradiation mechanism 200. If the mark measurement optical system 10 detects a contact state between the mold 4 and the imprint material 19 during the pressing step, the partial irradiation mechanism 200 irradiates the substrate 1 with the irradiation light 23. The mark measurement optical system 10 can move to detect the contact state at any location in the shot region 25 during the pressing step.

In the state where the mold 4 and the imprint material 19 are in contact, the imprint apparatus 100 detects the marks formed on the substrate 1 and the mold 4 by the mark measurement optical system 10, and aligns the pattern area 4a of the mold 4 and the shot region 25 of the substrate 1 based on a detection result. After the filling of the depression-protrusion pattern of the pattern area 4a with the imprint material 19 and the alignment between the mold 4 and the substrate 1, the irradiation unit 8 emits the curing light 8a toward the back surface (upper surface) of the mold 4, which is a curing step, to cure the imprint material 19 by the curing light 8a transmitted through the mold 4. After the imprint material 19 is cured, the imprint apparatus 100 widens a space between the mold 4 and the substrate 1 to release the mold 4 from the cured imprint material 19 (releasing step). Thus, the depression-protrusion pattern of the pattern area 4a formed on the mold 4 is transferred onto the imprint material 19 on the substrate 1.

Figure 3:
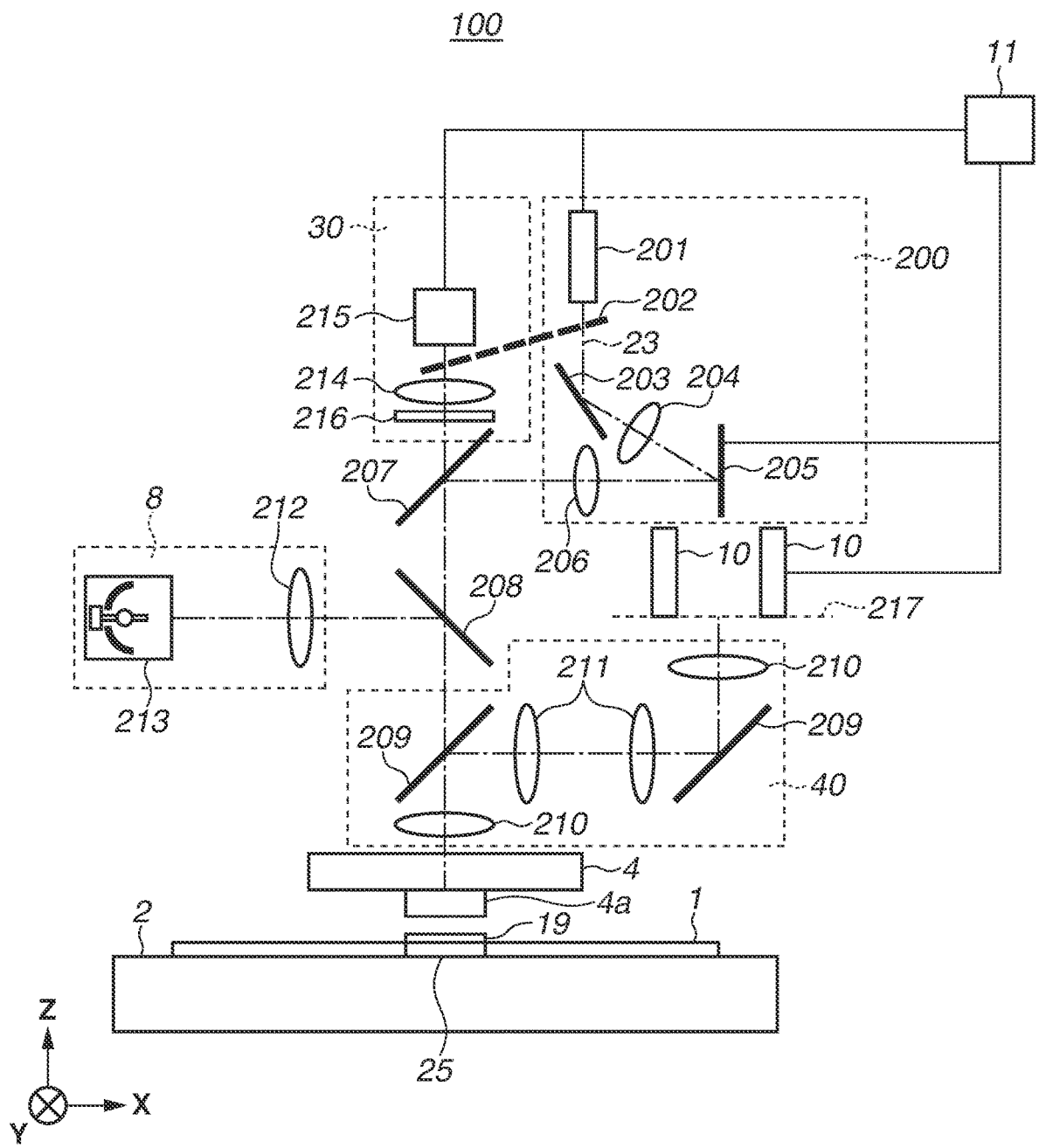
FIG. 3 is a diagram illustrating an imprint apparatus according to a second exemplary embodiment.

An imprint apparatus 100 according to a second exemplary embodiment will be described with reference to FIG. 3. FIG. 3 is a diagram schematically illustrating the imprint apparatus 100 including the detection unit and the partial irradiation mechanism 200. The partial irradiation mechanism 200 irradiates a shot region on the substrate 1 with light in a frame shape based on a detection result of the detection unit. FIG. 3 also schematically illustrates a configuration and arrangement of the partial irradiation mechanism 200 provided in the imprint apparatus 100. In the imprint apparatus 100 according to the second exemplary embodiment, an observation unit 30 is employed as the detection unit to determine an irradiation timing of the irradiation light 23 by the partial irradiation mechanism 200. In FIG. 3, the same reference numerals are used to indicate the same components as those of FIGS. 1 and 2, and explanation thereof is not repeated.

In the present exemplary embodiment, a high-power laser light source 201 is used as the light source 20 of the partial irradiation mechanism 200. Since the partial irradiation mechanism 200 needs to increase the viscosity of the imprint material 19 (cure the imprint material 19), the high-power laser light source 201 is employed. The irradiation light 23 from the laser light source 201 is reflected by a mirror 203, and illuminates the light modulation element 21 (a micromirror array 205 in the present exemplary embodiment) using an optical system 204. A reflection surface of the micromirror array 205 and the surface of the substrate 1 are set to have a substantially conjugate relationship using an optical system 206 and an optical system 210. Accordingly, if the control unit 11 controls each mirror of the micromirror array 205, a target illuminance distribution can be formed on the surface of the substrate 1 (shot region 25 of the substrate 1). Here, a case will be described where a frame-like illuminance distribution (irradiated area) is formed along the outer periphery of the shot region 25 (or the pattern area 4a). The partial irradiation mechanism 200 may increase the viscosity of the imprint material 19 without curing the imprint material 19 to reduce the extrusion of the imprint material 19 from the pattern area 4a (shot region 25).

In the imprint apparatus 100 according to the present exemplary embodiment, the observation unit 30 is provided to detect a contact state (filling degree) between the imprint material 19 supplied to the shot region 25 and the pattern area 4a of the mold 4. The observation unit 30 illuminates the surface of the substrate 1 with light from a light source 216, and forms an image of light from the substrate 1 and the pattern area 4a of the mold 4 on a surface of a sensor 215 through an optical system 214 and the optical system 210. The observation unit 30 can capture an image of the entire shot region 25 and can detect how a contact region between the pattern area 4a and the imprint material 19 expands from the vicinity of the center of the shot region 25 toward the outer periphery.

The irradiation unit 8 according to the present exemplary embodiment employs a high-pressure mercury lamp 213 as a light source. Light (curing light) from the high-pressure mercury lamp 213 is formed by an optical system 212 and the optical system 210 to illuminate the surface of the substrate 1.

It is difficult to dispose the mark measurement optical system 10 immediately above the mold 4 while the mark measurement optical system 10 avoids interference with light (curing light) from the irradiation unit 8 and with the supply unit 9. Thus, the imprint apparatus 100 according to the present exemplary embodiment includes a relay lens optical system 40 configured to form an image of the surface of the substrate 1 onto an imaging surface 217. The relay lens optical system 40 is an equal magnification imaging optical system in the present exemplary embodiment, and the optical systems 210 are symmetrically arranged, and optical systems 211 are symmetrically arranged. The mark measurement optical system 10 detects a mark formed on the substrate 1 or a mark formed on the mold 4 that are imaged on the imaging surface 217 by the relay lens optical system 40.

Here, the light sources of the irradiation unit 8 and the partial irradiation mechanism 200 need to emit light having a wavelength capable of curing the imprint material 19. However, it is preferable that the light sources used for the observation unit 30 and the mark measurement optical system 10 emit light that does not cure the imprint material 19. In the present exemplary embodiment, the irradiation unit 8 uses light having a wavelength of 380 nm or less (curing light 8a), and the partial irradiation mechanism 200 uses light having a wavelength of 390 nm to 410 nm (irradiation light 23). The observation unit 30 uses light having a wavelength of 410 nm to 490 nm, and the mark measurement optical system 10 uses light having a wavelength of 500 nm or more. The optical systems having such functions share a plurality of optical systems by a light combining unit.

The light combining unit employs a method using a mirror in which a transmittance and a reflectance are different in ratio, and a method using a dichroic mirror having a characteristic that the transmittance and the reflectance are different for each wavelength. In the case of using the mirror, part of light is used, resulting in a reduced efficiency. The dichroic mirror can separate light for each wavelength. However, it is necessary to have a margin in a wavelength band in consideration of manufacturing tolerance. In the present exemplary embodiment, a mirror 207 is employed as the light combining unit for light from the observation unit 30 and the partial irradiation mechanism 200. A dichroic mirror 208 is employed as a light combining unit for light from the irradiation unit 8 and the observation unit 30 or the partial irradiation mechanism 200. Dichroic mirrors 209 are employed as a light combining unit for light from the irradiation unit 8 and the mark measurement optical system 10 (relay lens optical system 40).

Whereas the high-power laser light source 201 is employed as the light source of the partial irradiation mechanism 200, the observation unit 30 does not require light with high illuminance. For this reason, if the laser light source 201 is turned on, the light reflected by the substrate 1 passes through the mirror 207 and is detected as stray light by the sensor 215 of the observation unit 30. This, a shutter 202 is provided so that the light from the partial irradiation mechanism 200 and the observation unit 30 do not become stray light.

(Imprinting Process)

Here, a sequence of an imprinting process in the present exemplary embodiment will be described with reference to a flowchart illustrated in FIG. 4. The imprint apparatus 100 repeats the flow of the imprinting process illustrated in FIG. 4 until the imprint process is completed for all the plurality of shot regions formed on the substrate 1.

In step S1, at a start of the imprinting process, the imprint material is supplied to a shot region to be processed of the substrate 1 held on the substrate stage 2 by using the supply unit 9. Then, the shot region supplied with the imprint material is placed under the pattern area 4a of the mold 4.

In step S2, a mold pressing process is performed in which the imprint material 19 supplied onto the substrate 1 and the pattern area 4a of the mold 4 are brought into contact with each other. At this time, the mold 4 may be moved close to the substrate 1 to contact the imprint material 19, or the substrate 1 may be moved close to the mold 4 to bring the imprint material 19 and the pattern area 4a into contact with each other. Alternatively, both the substrate 1 and the mold 4 may be moved close to each other to bring the imprint material 19 and the pattern area 4a into contact with each other.

In step S2, the pattern area 4a of the mold 4 and the imprint material 19 can be brought into contact with each other from the vicinity of the center of the shot region 25 in a state where the pattern area 4a is deformed into a protruded shape toward the substrate 1.

In step S3, filling of the pattern area 4a with the imprint material 19 is started. In step S3, the imprint material 19 contacting the pattern area 4a from the vicinity of the center of the shot region 25 in step S2 starts to spread toward the periphery of the shot region 25.

In step S4, the detection unit detects a contact state between the pattern area 4a and the imprint material 19. The mark measurement optical system 10, the observation unit 30, or a leak sensor can be employed as the detection unit. The leak sensor detects a change in a refractive index depending on whether there is a liquid, from multiple points.

In step S5, partial irradiation is started using the partial irradiation mechanism 200 based on the detection result of the contact state by the detection unit. In this way, the imprint apparatus 100 according to the present exemplary embodiment can adjust the irradiation timing of the irradiation light 23 based on the detection result of the contact state by the detection unit. In the partial irradiation in the present exemplary embodiment, a case will be described where a frame-shaped irradiated area is formed in an area along the outer periphery of the pattern area 4a (shot region 25) to prevent the imprint material from protruding from the shot region 25. The partial irradiation timing is to be within the time from the start of mold pressing to the start of irradiation for a curing process, and the irradiated area refers to an area to be irradiated with light around the pattern area 4a. Further, an irradiation amount refers to an amount of light energy per unit area (e.g., $W/m^2$) of the irradiated area.

In step S6, the substrate 1 and the mold 4 are aligned, and the entire shot region 25 is irradiated with the curing light 8a from the irradiation unit 8 in a state where the pattern area 4a and the imprint material 19 on the shot region 25 are in contact with each other (curing process). The substrate 1 and the mold 4 are aligned by the mark measurement optical system 10 detecting light from a mark formed on the substrate 1 and a mark formed on the mold 4. The irradiation of the curing light 8a is desirably performed after a relative positional deviation between the substrate 1 and the mold 4 reaches a target distance or less. The irradiation unit 8 irradiates the entire shot region 25 with the curing light 8a, and thus, the imprint material 19 on the substrate 1 is cured.

In step S7, the mold releasing process is performed. In the mold releasing process, after the imprint material 19 is cured, the pattern area 4a of the mold 4 is separated from the cured imprint material 19 by widening the space between the substrate 1 and the mold 4. The mold 4 is lifted by the drive device 6 to separate the mold 4 from the cured imprint material 19. In the mold releasing process, the substrate 1 may be lowered to separate the cured imprint material 19 from the pattern area 4a of the mold 4, or both the mold 4 and the substrate 1 may be driven to separate the pattern area 4a of the mold 4 and the cured imprint material 19 from each other.

In step S8, it is determined whether there is a shot region (unprocessed shot region) to be subjected to the imprint process next, among the plurality of shot regions formed on the substrate 1. In step S8, if it is determined that there is the shot region to be subjected to the imprint process next (YES in step S8), the processing returns to step S1 to perform the imprint process of steps S1 to S7 on the next shot region. In step S8, if it is determined that there is no shot region to be subjected to the imprint process next (NO in step S8), the imprint process ends, and the substrate 1 on which the pattern is formed is taken out from the imprint apparatus 100.

Partial irradiation process in step S5 in the present exemplary embodiment is to adjust the irradiation timing based on the detection result of the contact state in step S4. Thus, the conditions of the irradiated area and irradiation amount for partial irradiation are obtained in advance to be set as optimum conditions based on the size of the pattern area 4a, the size of the shot region 25, the type of the imprint material 19, and the dimensions of the imprint material 19 formed on the substrate 1. Further, if the optimum conditions differ depending on a position of the shot region 25 on the substrate 1, the conditions may be obtained for each shot region 25. Even if the imprint material 19 changes, there may be no change in the optimum conditions, or the optimum conditions may be obtained from past results without a prior test.

In the imprint apparatus 100 according to the present exemplary embodiment, a detection unit configured to detect a contact state between the mold 4 and the imprint material 19 on the substrate 1 is provided. Thus, a timing of irradiating the substrate 1 with the irradiation light whose intensity distribution is controlled can be controlled in real time. In the imprint apparatus 100, the observation unit 30 serving as the detection unit detects the contact state between the mold 4 and the imprint material 19, and the control unit 11 adjusts the timing of irradiation light from the partial irradiation mechanism 200 based on the detection result. For example, the partial irradiation can be started when a contact area between the mold 4 and the imprint material 19 whose images are captured by the observation unit 30 reaches a predetermined value, or the partial irradiation can be started when a predetermined position in the shot region 25 contacts the mold 4. The timing of irradiating light from the partial irradiation mechanism 200 is adjusted by controlling ON/OFF of the laser light source 201 serving as a light source, controlling opening/closing of the shutter 202, or controlling the reflection surface of the micromirror array 205 serving as a light modulation element.

As described above, the timing of the partial irradiation can be controlled depending on the contact state based on the detection result of the detection unit, thereby making it possible to prevent the protrusion of the imprint material 19 from the shot region 25 (pattern area 4a) depending on the contact state.

Figure 5:
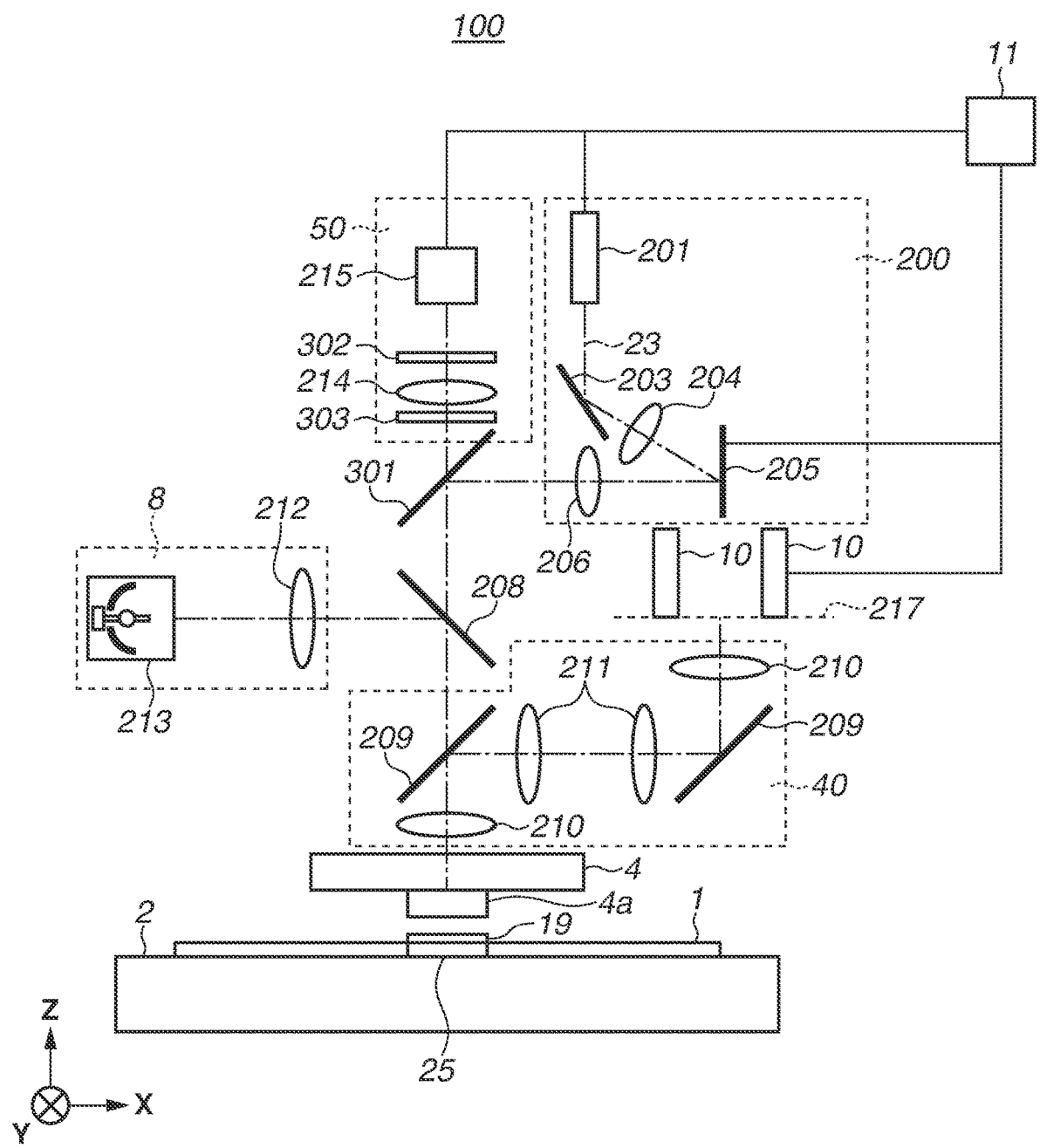
FIG. 5 is a diagram illustrating an imprint apparatus according to a third exemplary embodiment.

An imprint apparatus 100 according to a third exemplary embodiment will be described with reference to FIG. 5. FIG. 5 is a diagram schematically illustrating the imprint apparatus 100 including the detection unit and the partial irradiation mechanism 200. The partial irradiation mechanism 200 irradiates a shot region on the substrate 1 with light in a frame shape based on a detection result of the detection unit. T FIG. 5 also schematically illustrates a configuration and arrangement of the partial irradiation mechanism 200 provided in the imprint apparatus 100. In the imprint apparatus 100 according to the third exemplary embodiment, an observation unit 50 is employed as the detection unit to determine an irradiation timing of the irradiation light 23 by the partial irradiation mechanism 200. In FIG. 5, the same reference numerals are used to indicate the same components as those of FIGS. 1 to 3, and explanation thereof is not repeated.

The imprint apparatus 100 according to the third exemplary embodiment includes the observation unit 50 configured to always observe a shot region during the imprint process. Thus, the imprint apparatus 100 can provide the partial irradiation mechanism 200 configured to perform control in real time.

It is necessary for the observation unit 50 to be used simultaneously with the irradiation unit 8, the mark measurement optical system 10, and the partial irradiation mechanism 200. Thus, a light source that emits light having a wavelength of 430 nm to 490 nm is employed as a light source 303 of the observation unit 50 of the imprint apparatus 100 according to the third exemplary embodiment. Since wavelength bands used by the observation unit 50 and the partial irradiation mechanism 200 are different from each other, a dichroic mirror 301 can be employed as a light combining unit for the two optical systems. Further, a wavelength filter 302 is formed in the observation unit 50 to prevent light other than the light from the light source 303 of the observation unit 50 from entering the sensor 215. The wavelength filter 302 may include a short wavelength cut filter that does not transmit light having a wavelength of less than 430 nm, a long wavelength cut filter that does not transmit light having a wavelength of more than 490 nm, or both the short wavelength cut filter and the long wavelength cut filter.

In the partial irradiation according to the present exemplary embodiment, the observation unit 50 observes spread of contact between the pattern area 4a and the imprint material 19, and the partial irradiation mechanism 200 (micromirror array 205) is controlled based on an observation result. A method of controlling the partial irradiation mechanism 200 will be described below.

FIGS. 6A, 6B, 6C, and 6D are diagrams illustrating examples of control of the micromirror array 205 provided in the partial irradiation mechanism 200. More specifically, FIGS. 6A to 6D illustrate the shot region 25 (pattern area 4a) as viewed from above (+Z direction). As illustrated in FIGS. 6A to 6D, the shot region 25 typically has a rectangular shape.

As illustrated in FIG. 6A, detection areas 501 to 504 are set corresponding to four sides of the shot region 25. For each of the detection areas 501 to 504, a contact state between the pattern area 4a of the mold 4 and the imprint material 19 on the shot region 25 is detected by the detection unit. With regard to the method of controlling the partial irradiation mechanism 200, control of the light modulation element 21 by the control unit 11 will be described. In the third exemplary embodiment, the observation unit 50 is employed as the detection unit, and the micromirror array 205 is employed as the light modulation element. An image 500 illustrated in FIG. 6A is an image obtained by the sensor 215 of the observation unit 50. When filling of the pattern area 4a with the imprint material 19 described in step S3 of FIG. 4 is started, intensity of light from the substrate 1 and the mold 4 changes depending on the contact state between the mold 4 and the imprint material 19. Accordingly, intensity of light detected by the sensor 215 of the observation unit 50 also changes.

A control map 510 illustrated in FIG. 6B indicates an intensity distribution of irradiation light with which the substrate 1 is irradiated. In the present exemplary embodiment, a frame-shaped area along the outer periphery of the shot region 25 is irradiated with light. As illustrated in FIG. 6B, the frame-shaped area (irradiated areas 511 to 514) along the outer periphery of the shot region 25 is selectively irradiated with light, and thus, the imprint material 19 can be prevented from protruding from the shot region 25. For the control map 510 illustrated in FIG. 6B, the irradiated area, a light amount, and a timing of the irradiation light are controlled by the micromirror array 205.

The imprint apparatus 100 according to the present exemplary embodiment monitors changes in the light intensity detected by the sensor 215 at four places of the detection area 501, the detection area 502, the detection area 503, and the detection area 504 in the image 500 captured by the observation unit 50. If a change in the light intensity in any of the detection areas 501 to 504 reaches a threshold value or more after the filling with the imprint material 19 is started, the control unit 11 of the imprint apparatus 100 controls the partial irradiation mechanism 200 so that the irradiated area indicated in the control map 510 is irradiated with the irradiation light.

If changes in the light intensity detected in the detection areas 501 to 504 are detected in different timings, the area to be irradiated with the irradiation light can be controlled for each of the detection areas. The detection area 501 corresponds to the irradiated area 511, the detection area 502 corresponds to the irradiated area 512, the detection area 503 corresponds to the irradiated area 513, and the detection area 504 corresponds to the irradiated area 514, respectively. By detecting the change in the light intensity in each of the detection areas 501 to 504, the corresponding micromirror array 205 can be controlled so that the corresponding irradiated area is irradiated with light. This makes it possible to irradiate the substrate 1 with the irradiation light in timing suitable for the contact state between the imprint material 19 and the pattern area 4a, even if the contact state between the imprint material 19 and the mold 4 is different for each of the sides of the shot region 25. This can prevent the imprint material 19 from protruding from the shot region 25.

Further, as illustrated in FIG. 6C, in the image 500 indicating the shot region 25, a detection area 520 being a collection of the detection areas (pixels) may be provided to correspond to the entire periphery of the shot region 25. The timing of partial irradiation for preventing the imprint material 19 from being extruded cannot be uniquely determined because the timing is affected by a surface condition of the substrate 1 and characteristics of the imprint material 19. Accordingly, the imprint material 19 cannot be prevented from being extruded stably.

Thus, the micromirror array 205 corresponding to an irradiated area 530 of the control map 510 illustrated in FIG. 6D is controlled depending on the change in the light intensity in each of the detection areas (each of the pixels) in the detection area 520. Such a large number of the detection areas (pixels) makes it possible not only to detect a contact state in each of the detection areas, but also to measure a filling speed at a portion between two different detection areas. In the example illustrated in FIGS. 6C and 6D, the large number of the detection areas (pixels) makes it possible to control the extrusion of the imprint material 19 in the irradiated area 530 corresponding to the detection areas, but it is necessary to perform image data processing and calculation processing in a short time. For this reason, the observation unit 50 is required to have high-performance image processing capability. Accordingly, the observation unit 50 may include equipment such as an edge computing system, a graphics processing unit (GPU), a field-programmable gate array (FPGA) (reconfigurable hardware integrated circuit), and a dedicated processor.

Figure 4:
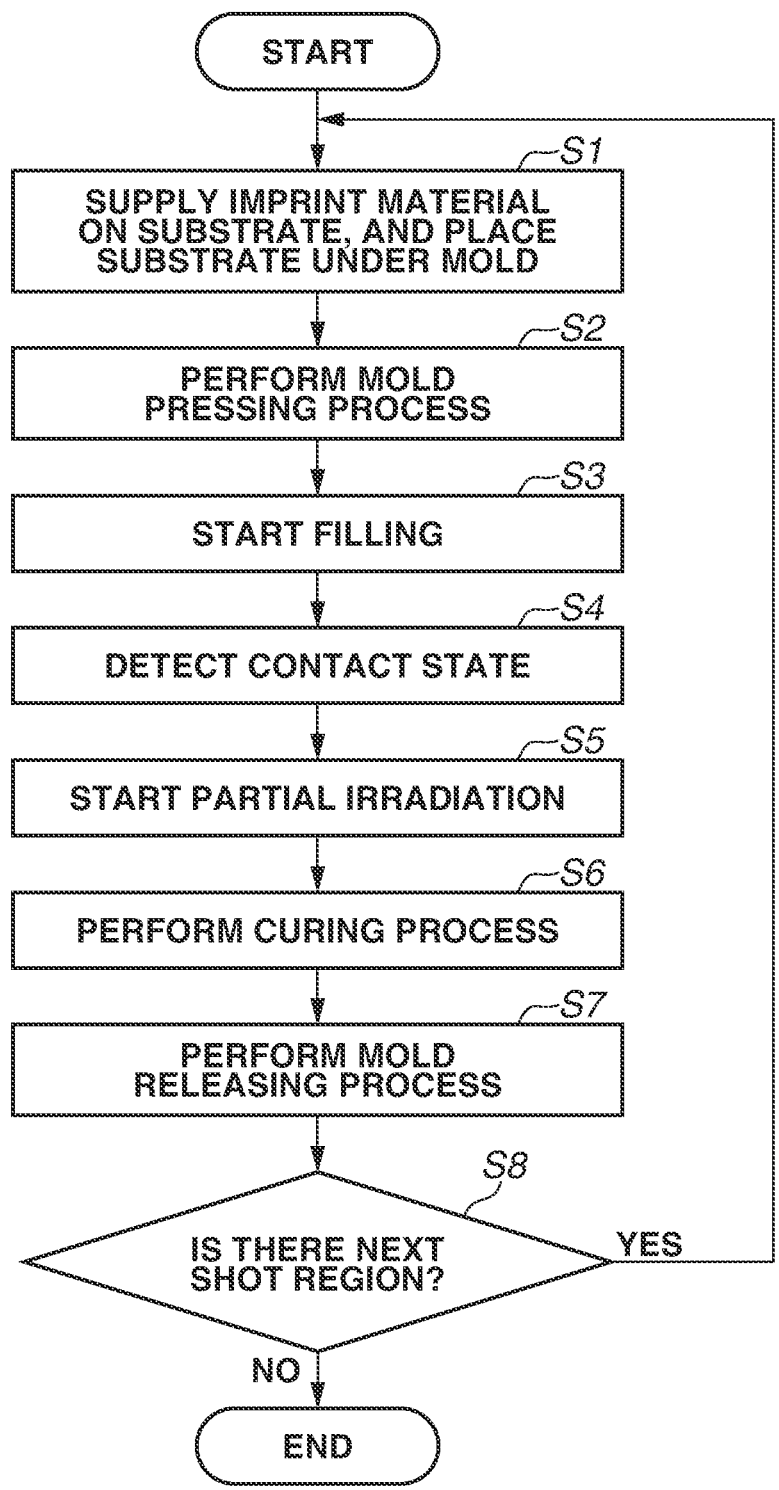
FIG. 4 is a flowchart illustrating an imprinting process.

Similar to the imprinting process illustrated in FIG. 4, in an imprinting process according to the present exemplary embodiment, the filling is started in step S3, and then a contact state in a detection area of the observation unit 50 serving as a detection unit is detected in step S4. In step S5, the timing of partial irradiation by the partial irradiation mechanism 200 is controlled based on the detection result in the detection area of the observation unit 50. At this time, a filling speed with the imprint material 19 at each position in the detection area of the observation unit 50 may be calculated, and the irradiation timing of the irradiation light in the irradiated area 530 may be calculated from the calculated speed to control the partial irradiation mechanism 200. While it is necessary to perform high-speed image processing and calculation processing from the start of filling to the partial irradiation, the actual spread of the imprint material 19 is reflected on irradiation conditions, and thus, the extrusion of the imprint material 19 can be reduced at each position of the outer periphery of the shot region 25.

In the above description, the imprint apparatus employs an imprinting method of curing the imprint material 19 using the photo-curing method. However, the exemplary embodiments are not limited to using the photo-curing method, and alternatively, a method of curing the imprint material 19 with heat may be employed. In the photo-curing method, an ultraviolet curable resin is used. The resin is irradiated with ultraviolet light to cure the resin in a state where the mold is pressed against the substrate through the resin, and then the mold is released from the cured resin, to form a pattern. In the exemplary embodiments, ultraviolet light is employed as the curing light. However, a wavelength of the light can be appropriately determined to suit the imprint material 19 supplied onto the substrate 1. On the other hand, in the curing method with heat, a thermoplastic resin is heated to the glass transition temperature or more, the mold is pressed against the substrate through the resin in a state where the fluidity of the resin is increased, the resin is cooled, and then the mold is released from the resin, to form a pattern.

(Method of Manufacturing Product)

The pattern of a cured product formed by using the imprint apparatus is employed permanently on at least part of various products, or temporarily in manufacturing various products. The products include an electric circuit element, an optical element, a micro electro mechanical system (MEMS) device, a recording element, a sensor, and a mold. Examples of the electric circuit element include a volatile or non-volatile semiconductor memory such as a dynamic random access memory (DRAM), a static random access memory (SRAM), a flash memory, and a magnetoresistive random access memory (MRAM), and a semiconductor device such as a large scale integration (LSI), a charge-coupled device (CCD), an image sensor, and an FPGA. An example of the mold includes an imprint mold.

The pattern of the cured product is used as it is as at least part of a product such as the above-mentioned products, or temporarily used as a resist mask for the product. The resist mask is removed after etching, ion implantation, or the like in a processing step for a substrate.

Figure 7A:
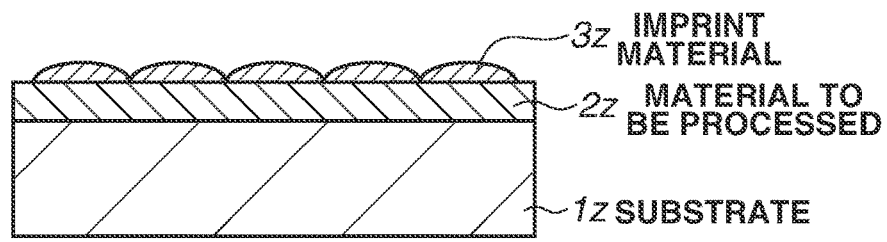
FIGS. 7A, 7B, 7C, 7D, 7E, and 7F are diagrams illustrating a method of manufacturing a product.

Next, a specific method of manufacturing the product will be described. As illustrated in FIG. 7A, a substrate $1z$ such as a silicon wafer on which a material to be processed $2z$ such as an insulator is formed is prepared. Then, an imprint material $3z$ is applied on a surface of the material to be processed $2z$ by an inkjet method or the like. Here, a state is illustrated in which the imprint material $3z$ in a form of a plurality of droplets is applied on the substrate.

Figure 7B:
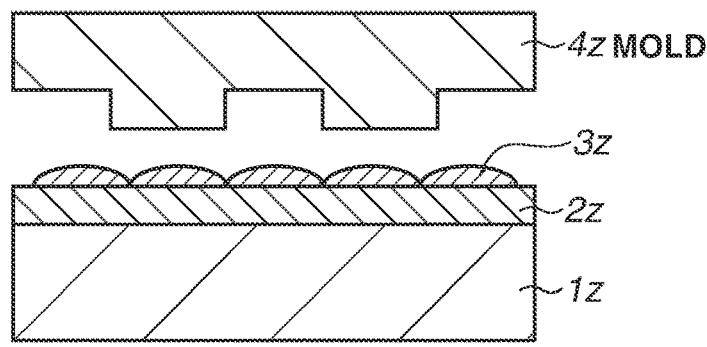
Figure 7C:
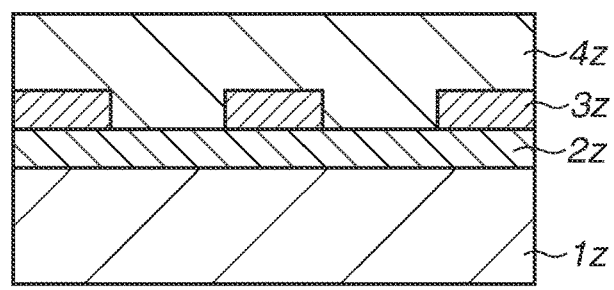

As illustrated in FIG. 7B, an imprint mold $4z$ faces the imprint material $3z$ on the substrate so that a side of the imprint mold $4z$ on which the depression-protrusion pattern is formed faces the imprint material $3z$. As illustrated in FIG. 7C, the substrate $1z$ on which the imprint material $3z$ is applied is brought into contact with the mold $4z$, and pressure is applied to the contacted substrate $1z$ and mold $4z$. A space between the mold $4z$ and the material to be processed $2z$ is filled with the imprint material $3z$. In this state, the imprint material $3z$ is cured if the imprint material $3z$ is irradiated with light as curing energy through the mold $4z$.

Figure 7D:
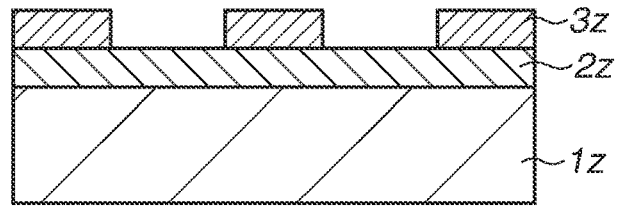

As illustrated in FIG. 7D, after the imprint material $3z$ is cured, the mold $4z$ is released from the substrate $1z$, and a pattern of a cured product of the imprint material $3z$ is formed on the substrate $1z$. The pattern of the cured product has a shape in which a depressed portion of the mold $4z$ corresponds to a protruded portion of the cured product, and a protruded portion of the mold $4z$ corresponds to a depressed portion of the cured product. In other words, the depression-protrusion pattern of the mold $4z$ is transferred onto the imprint material $3z$.

Figure 7E:
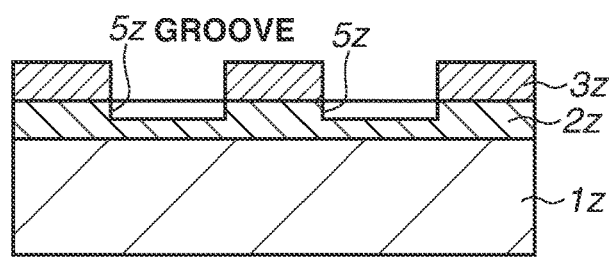
Figure 7F:
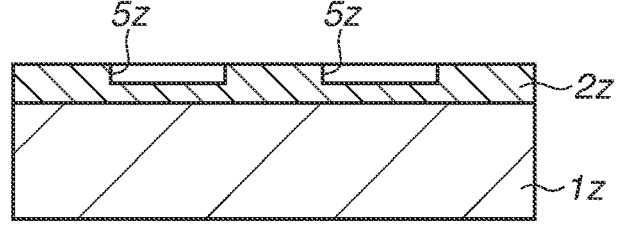

As illustrated in FIG. 7E, if etching is performed using the pattern of the cured product serving as an anti-etching mask, a portion of the surface of the material to be processed $2z$ where there is no cured product or a cured product remains thin is removed to form a groove $5z$. As illustrated in FIG. 7F, when the pattern of the cured product is removed, a product in which the groove $5z$ is formed on the surface of the material to be processed $2z$ can be obtained. While the pattern of the cured product is removed here, the pattern may not be removed after processing and may be employed as, for example, a film for interlayer insulation included in a semiconductor device or the like, i.e., a constituent member of the product.

While the exemplary embodiments of the present invention are described above, the present invention is not limited to the exemplary embodiments, and various modifications and changes are possible within the range of the gist of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-059214, filed Mar. 26, 2019, which is hereby incorporated by reference herein in its entirety.

What is claimed is:

1. An imprint apparatus for forming a pattern of an imprint material on a substrate by using a mold including a pattern formation area, the imprint apparatus comprising:
   a detection unit configured to detect a contact state of the imprint material on the substrate with the mold;
   a first light irradiation unit configured to irradiate the imprint material with light to cure the imprint material;
   a second light irradiation unit configured to irradiate the substrate with irradiation light, wherein the second light irradiation unit includes a light modulation element configured to control an intensity distribution of the irradiation light that is irradiated by the second light irradiation unit and that irradiates the substrate, wherein the second light irradiation unit is different from the first light irradiation unit; and
   a processor configured to perform operations, the operations comprising:
      controlling a timing of irradiating the substrate, by the second light irradiation unit, with the irradiation light having the intensity distribution controlled by the light modulation element based on a detection of the contact state by the detection unit, wherein the contact state is a state of physical contact between the imprint material and the mold, wherein the state of physical contact between the imprint material and the mold is an area of physical contact between the imprint material and the mold that is equal to or greater than a specified size, and wherein the specified size is less than an area of the mold, and
      controlling the first light irradiation unit to irradiate the imprint material with light to cure the imprint material,
   wherein a wavelength of light emitted from the second light irradiation unit comprises a wavelength to cure the imprint material or to increase viscosity of the imprint material.

2. The imprint apparatus according to claim 1, wherein the detection unit is an observation unit configured to observe an entire shot region formed on the substrate.

3. The imprint apparatus according to claim 1, wherein the detection unit is a measurement unit configured to detect light from a mark formed on the mold and a mark formed on the substrate to measure a relative position between the mold and the substrate.

4. The imprint apparatus according to claim 1, wherein the detection unit detects the contact state between the imprint material and the mold based on a change in a light amount from the substrate.

5. The imprint apparatus according to claim 1, wherein the light modulation element is a digital micromirror device.

6. The imprint apparatus according to claim 1, wherein the processor is further configured to control the light modulation element to irradiate the substrate with the irradiation light in an area along an outer periphery of a shot region formed on the substrate without irradiating an area inside the outer periphery of the shot region.

7. The imprint apparatus according to claim 1, wherein the state of physical contact between the imprint material and the mold is physical contact between the imprint material and the mold in a detection area set in a shot region formed on the substrate.

8. The imprint apparatus according to claim 1,
wherein a shot region formed on the substrate has a rectangular shape, and
wherein the detection unit detects the contact state when the mold and the imprint material are in physical contact in each of a plurality of detection areas, wherein each detection area of the plurality of detection areas is located at a respective side of the shot region.

9. The imprint apparatus according to claim 1, wherein a wavelength of light emitted from the first light irradiation unit is different from a wavelength of light emitted from the second light irradiation unit.

10. The imprint apparatus according to claim 1, wherein an entire region of a shot region is irradiated with light emitted from the first light irradiation unit, and a partial region of the shot region is irradiated with light emitted from the second light irradiation unit.

11. The imprint apparatus according to claim 1, wherein a range of wavelengths of light emitted from the first light irradiation unit is different from a range of wavelengths of light emitted from the second light irradiation unit, and
wherein the range of wavelengths of light emitted from the first light irradiation unit does not overlap the range of wavelengths of light emitted from the second light irradiation unit.

12. The imprint apparatus according to claim 1, wherein the specified size is less than an area of a shot region formed on the substrate.

13. An imprint apparatus comprising:
a detection unit configured to detect a first contact state and a second contact state between a mold and an imprint material on a substrate, wherein the mold includes a pattern formation area, wherein the first contact state is a state of physical contact between the mold and the imprint material, wherein the first contact state is a state in which the pattern formation area of the mold contacts the imprint material regardless of whether the pattern formation area has been filled with the imprint material and wherein the second contact state is a state of physical contact between the mold and the imprint material that is different from the first contact state;
a first light irradiation unit configured to irradiate the imprint material with light to cure the imprint material;
a second light irradiation unit configured to emit irradiation light to radiate the imprint material, wherein the second light irradiation unit includes a light modulation element configured to control an intensity distribution of the irradiation light that is emitted from the second light irradiation unit and that irradiates the imprint material; and
a processor configured to perform operations, the operations comprising:
in response to detection of the first contact state by the detection unit, controlling the second light irradiation unit to change from an inactive state to an activate state in which the second light irradiation unit irradiates the imprint material with the irradiation light having the intensity distribution controlled by the light modulation element, and
after activating the second light irradiation unit to irradiate the imprint material with the irradiation light, controlling the first light irradiation unit to irradiate the imprint material with light to cure the imprint material in response to detection of the second contact state by the detection unit.

14. The imprint apparatus according to claim 13, wherein the second contact state is a state in which the pattern formation area has been filled with the imprint material.

15. An imprint apparatus comprising:
a substrate stage configured to hold a substrate;
a mold holding unit configured to hold a mold, wherein the mold includes a pattern formation area;
a detection unit configured to detect a first contact state and a second contact state between the mold and an imprint material on the substrate, wherein the first contact state is a state of physical contact between the mold and the imprint material, and wherein the second contact state is a state of physical contact between the mold and the imprint material that is different from the first contact state;
a first light irradiation unit configured to irradiate the imprint material with light to cure the imprint material;
a second light irradiation unit configured to emit irradiation light to radiate the imprint material, wherein the second light irradiation unit includes a light modulation element configured to control an intensity distribution of the irradiation light that is emitted from the second light irradiation unit and that irradiates the imprint material; and
a processor configured to perform operations, the operations comprising:
controlling one or both of the substrate stage and the mold holding unit to move the mold and the substrate into contact with each other;
after controlling one or both of the substrate stage and the mold holding unit to move the mold and the substrate into contact with each other, controlling the second light irradiation unit to irradiate the imprint material with the irradiation light having the intensity distribution controlled by the light modulation element in response to detection of the first contact state by the detection unit,
after starting to control the second light irradiation unit to irradiate the imprint material with the irradiation light, controlling the first light irradiation unit to irradiate the imprint material with light to cure the imprint material in response to detection of the second contact state by the detection unit,
controlling the first light irradiation unit and the second light irradiation unit to stop irradiating the imprint material, and
after controlling the first light irradiation unit and the second light irradiation unit to stop irradiating the imprint material, controlling one or both of the substrate stage and the mold holding unit to move the mold and the substrate out of contact with each other.

* * * * *